United States Patent [19]
Scholz

[11] Patent Number: 4,565,314
[45] Date of Patent: Jan. 21, 1986

[54] REGISTRATION AND ASSEMBLY OF INTEGRATED CIRCUIT PACKAGES

[75] Inventor: Harry R. Scholz, Lower Macungie Township, Lehigh County, Pa.

[73] Assignee: AT&T Bell Laboratories, Murray Hill, N.J.

[21] Appl. No.: 530,743

[22] Filed: Sep. 9, 1983

[51] Int. Cl.[4] ............................................. H01L 21/98
[52] U.S. Cl. .................... 228/180.2; 29/834; 361/400
[58] Field of Search .............. 357/80, 85; 228/180 A; 29/834; 361/400

[56] References Cited

U.S. PATENT DOCUMENTS

| | | | |
|---|---|---|---|
| 3,184,831 | 5/1965 | Siebertz | 228/180 A |
| 3,379,937 | 4/1968 | Shepherd | 361/400 X |
| 4,032,058 | 6/1977 | Riseman | 228/180 A |
| 4,070,120 | 1/1978 | Bald et al. | 403/13 |
| 4,288,808 | 9/1981 | Hantusch | 29/834 X |
| 4,332,341 | 6/1982 | Minetti | 228/180 A |
| 4,421,266 | 12/1983 | Bock | 228/180 A |

Primary Examiner—Kenneth J. Ramsey
Attorney, Agent, or Firm—Peter V. D. Wilde

[57] ABSTRACT

The so-called blind assembly operation involving precise registration between the blind side of chip carriers or similar macro scale subassemblies and a metallized (patterned) support member requires improvements to reduce packaging costs. The proposal is to form indents aligned in both mating surfaces and place an aligning ball in the lower indent. The upper surface is positioned approximately and manipulated in x and y directions until the alignment ball recesses into both indents.

2 Claims, 13 Drawing Figures

REGISTRATION AND ASSEMBLY OF INTEGRATED CIRCUIT PACKAGES

BACKGROUND OF THE INVENTION

An effective method for the blind assembly of surface mountable semiconductor packages such as chip carriers to ceramic or epoxy-glass interconnect boards has been an elusive goal in integrated circuit packaging technology. Chip carrier designs containing closely packed conductor pads or pins must be precisely aligned during assembly to an array of conductor pads on the support or interconnection board. In many cases, however, an optical alignment of the conductor pads on the mating surfaces is difficult because they are recessed from the edge of the carrier and consequently obscured from view. Therefore, alignment schemes that use either fiducial markings or package edge registration techniques are often employed. Both of these approaches have drawbacks.

STATEMENT OF THE INVENTION

I propose to align the chip carrier with the support board using a technique that I term "ball alignment". This technique involves the provision of indents in each mating surface. A small ball is placed between the two surfaces and one is moved relative to the other or both are moved until the ball lodges in both indents. At that point, alignment is assured even though the ball and the indents are not visible. A single indexing ball insures only the x and y coordinate alignment of the indents, since all in-plane rotations $\theta_z$ are permitted. Two indexing balls insure a unique alignment of all points on the mating parts provided the indents are not symmetrically placed. Three indexing balls prevent all out-of-place rotations in addition to providing a unique alignment scheme.

DETAILED DESCRIPTION

The following detailed description contains exemplary embodiments based upon the principle teachings of the invention.

Figure 1A:
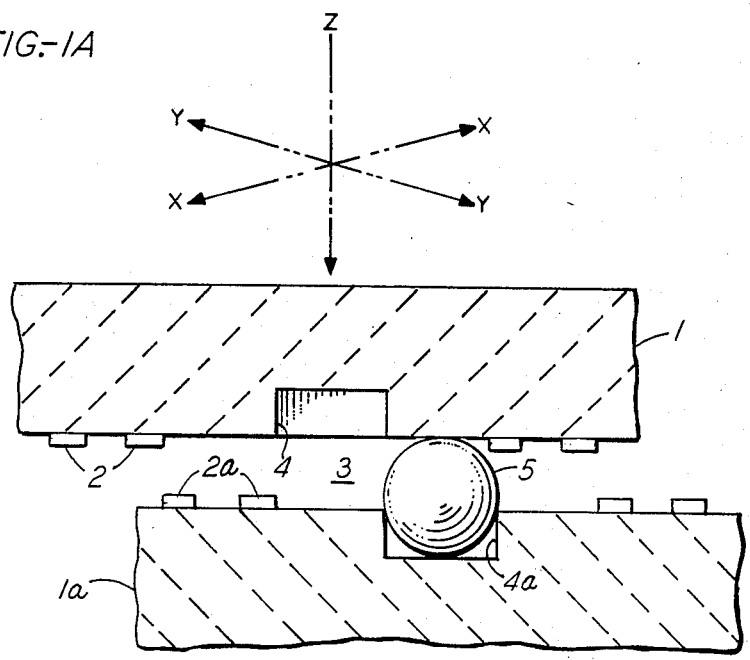
FIGS. 1A and 1B illustrate schematically the principles on which the invention is based.
Figure 1B:
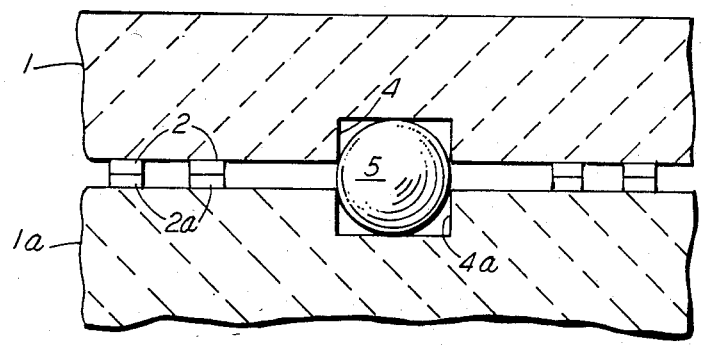
Figure 2:
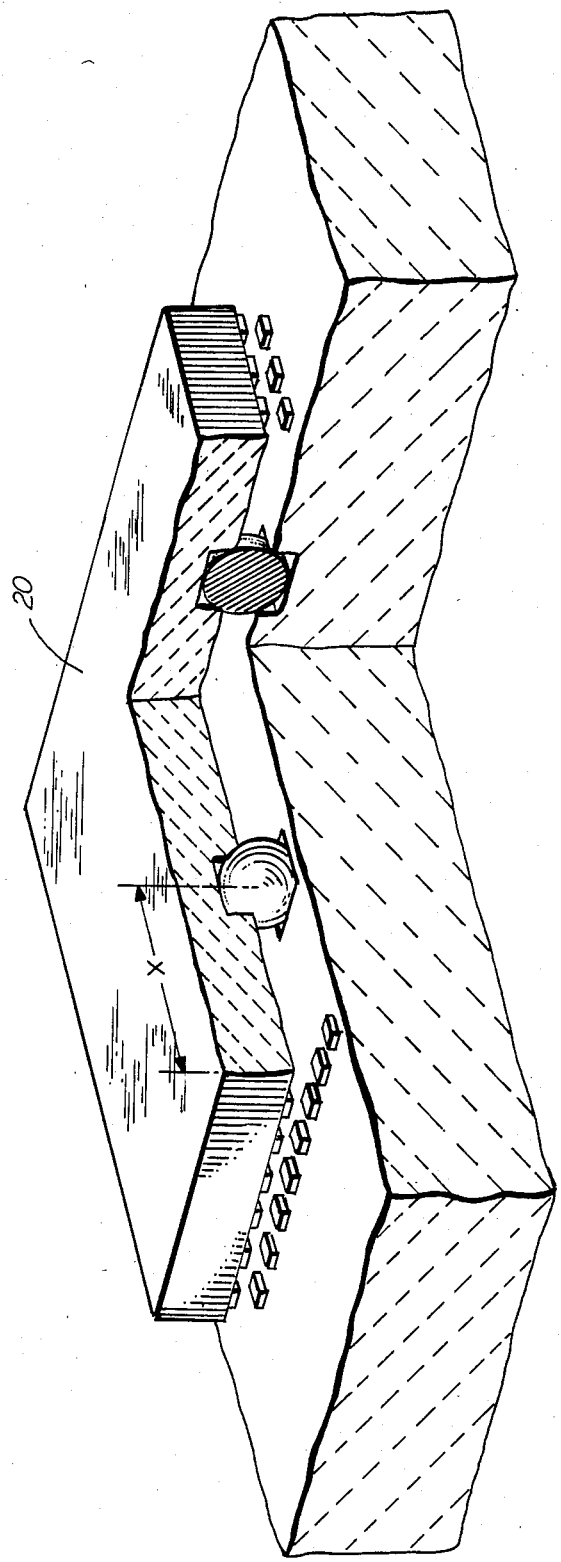
FIG. 2 is a prespective view partly cut away illustrating pictorially the principles described in conjunction with FIG. 1.

FIG. 1 illustrates a typical task which the invention is designed to perform. Two substrates, upper substrate 1 and lower substrate 1a, each carry elements 2 and 2a which are to be aligned in some fashion across the interface as the result of correctly positioning substrates 1 and 1a relative to one another. Since the elements 2 and 2a are often not visible while the substrates are arranged together, proper alignment is difficult to ensure. It is especially difficult when the edges are not precisely formed or otherwise are not reliable indices for the elements 2 and 2a (i.e. dimension "X" in FIG. 2 is not controlled). The alignment tool proposed here is shown at 3, and comprises indents 4 and 4a formed in substrates 1 and 1a, and aligning ball 5.

The single alignment ball shown in FIG. 1 is adequate for preventing displacement between substrates 1 and 1a in either the x or y directions. However, angular ($\theta_z$) rotations about ball 5 are not prevented, and a second ball alignment device may be required. Such an arrangement is shown in FIG. 2. If the two ball alignment devices are asymmetrically placed with respect to the center of chip package 20, then a unique orientation is guaranteed. If they are placed symmetrically, two orientations will be allowed ($\theta_z=0$, 180 degrees). Applications will be found for both arrangements.

Figure 3:
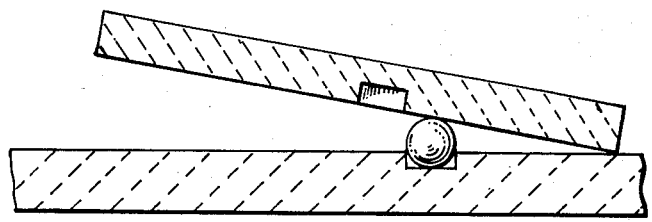
FIG. 3 is a schematic view illustrating the advantages of a further embodiment of the invention.

The arrangement shown in FIG. 1 allows the substrates to "tilt" out of planarity (see FIG. 3) prior to the point where the ball is seated into both recesses (and even after registration is achieved if the radius of the ball exceeds the depth of the recess, or the diameter exceeds the width of the recess). Consequently, it may be advantageous in some applications to have three or more ball alignment devices.

There are a variety of choices for the alignment operation itself. Typically, the indents or recesses in the lower substrate will be "loaded" with alignment balls and the upper substrate placed over the lower and manipulated in the x and y directions until each ball seats into an indent in the upper substrate. Choice of the dimensions for the alignment ball and the indents will influence the alignment operation in a variety of ways.

Figure 4:
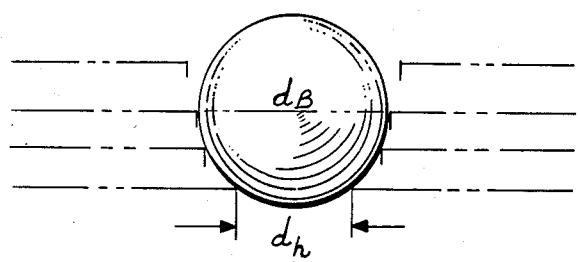
FIG. 4 is a diagram showing alternative alignment ball positions.

FIG. 4 illustrates the effect of varying the ratio of the ball diameter $d_b$ to the diameter (or width) of the recess, $d_h$. If $d_h$ exceeds $d_b$ appreciably, misalignment may occur, because the ball is free to move uncontrollably in x or y directions. If $d_b$ exceeds $d_h$ appreciably the ball is unstable in the indent and can be easily dislodged unless it is bonded in place. The recommended range is $d_b = d_h \pm 20\%$ and preferably 10% (if $d_b = 1.2\ d_h$ more than three quarters of the "height" of the ball is above the plane of the hole.)

Figure 5A:
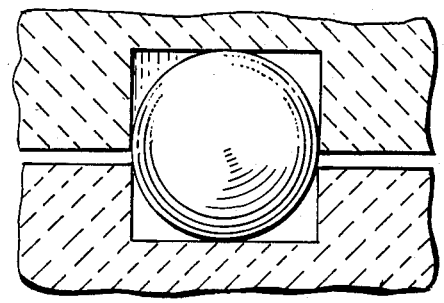
FIGS. 5A and 5B are diagrams showing alternative indent sizes.
Figure 5B:
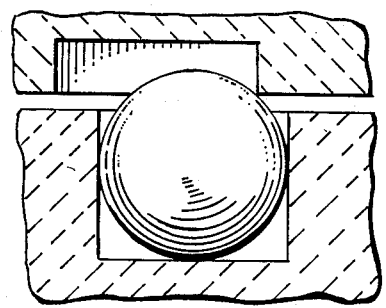

It is important to have a substantial portion of the ball protrude above the surface of the substrate. As illustrated in FIGS. 5A and 5B, the effectiveness of the lock with the indent in the upper substrate is strong in FIG. 5A but weak in FIG. 5B. (In fact, if in FIG. 5B the indent in the upper substrate is the same size as the indent in the lower substrate as shown, the substrates are likely to be misaligned as shown.) Accordingly it is useful, although not required, to have at least a third of the diameter of the ball protrude above the surface of the lower substrate. The shape of the indent may vary widely, e.g. that of a cone, cube, cylinder, pyramid, etc. For some applications it may be useful to adjust the depth of the indent to control the amount of projection desired for the alignment ball, and provide a cylindrical or other appropriately shaped indent slightly larger than the ball (See FIG. 5). For other applications the size of the hole at the top of the indent (FIG. 4) or the taper of the sidewalls will determine the amount of protrusion of the alignment ball.

Figure 6:
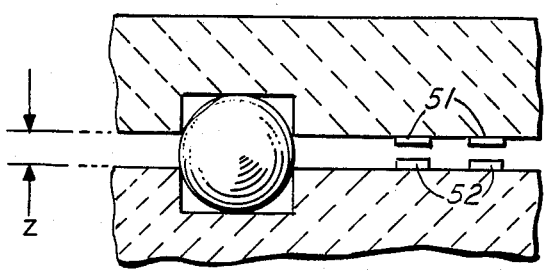
FIG. 6 is a diagram illustrating a standoff arrangement obtainable by proper choice of alignment ball and indent sizes.

I have also found useful the expedient of designing for an intentional standoff between the two substrates that is preserved after alignment. Such a design is shown in FIG. 6. The standoff distance z is obtained either by making the opening of either (or both) indent(s) smaller than the ball diameter (shown) or by adjusting appropriately the depth of either (or both) indent(s). This expedient is especially useful when the elements to be mated e.g. 51 and 52 in FIG. 6 project from the substrate surface.

Having outlined the general considerations that apply to the invention, we turn now to specific applications that have been demonstrated and with respect to which we regard the invention as potentially valuable.

Figure 7:
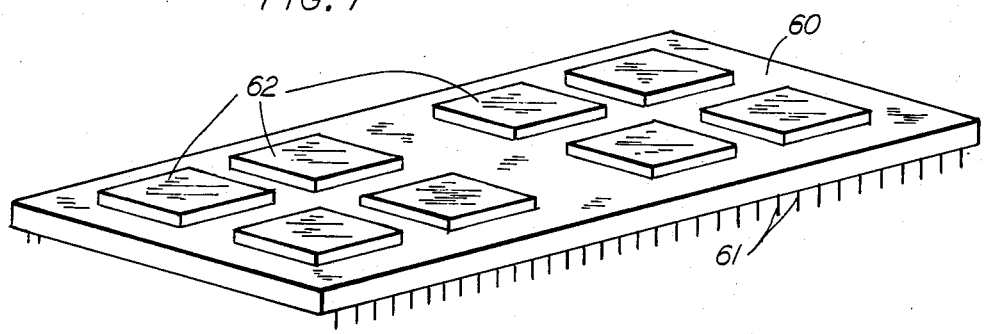
FIG. 7 is a perspective view of a chip carrier assembly embodying the invention.
Figure 8A:
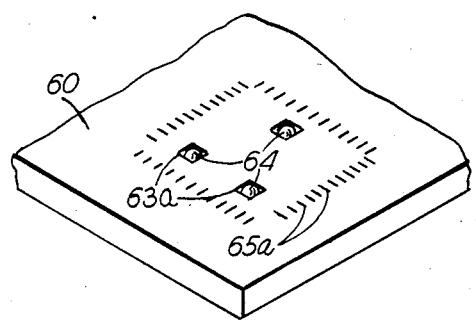
FIGS. 8A and 8B are views of the chip carrier support board and the chip carrier respectively.
Figure 8B:
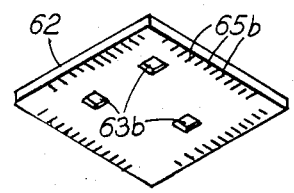

FIG. 7 shows a module assembly comprising support board 60, pin outs 61, and an array of chip carriers 62. The support board is typically a laminated structure and comprises a multilevel interconnect assembly for routing electrical interconnections from the chip carriers 62 to the input-output pins 61. The support board is typically an epoxy-glass multilayer board or an alumina co-fired ceramic. A portion of the board 60, prior to attachment of the chip carriers 62 is shown in FIG. 8A. A chip carrier, prior to mounting on the board, is shown in FIG. 8B. The contact patterns on each, which are designed to register when the chip carrier and board are properly aligned, are evident in these views. Also evident are the ball alignment indents, 63a on board 60, and 63b on chip carrier 62. The alignment balls are shown at 64. The contact patterns 65a and 65b typically comprises a series of solder balls, bars, strips or the like.

Figure 9A:
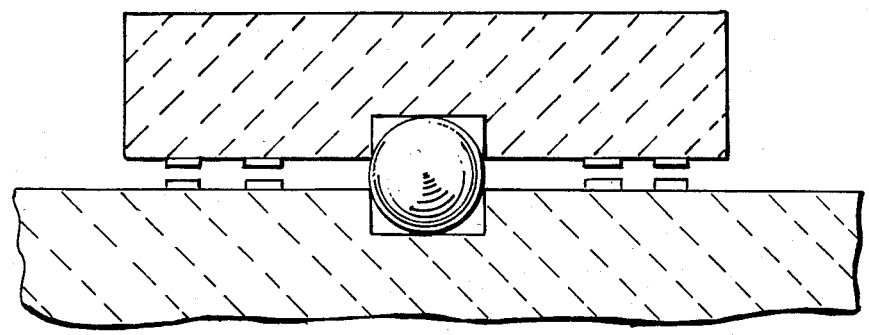
FIGS. 9A and 9B are sectional views of a portion of FIG. 8A before and after final bonding.

In FIG. 9A, a portion of the board and a chip carrier are shown placed together, and aligned, using the ball alignment technique described earlier.

Figure 9B:
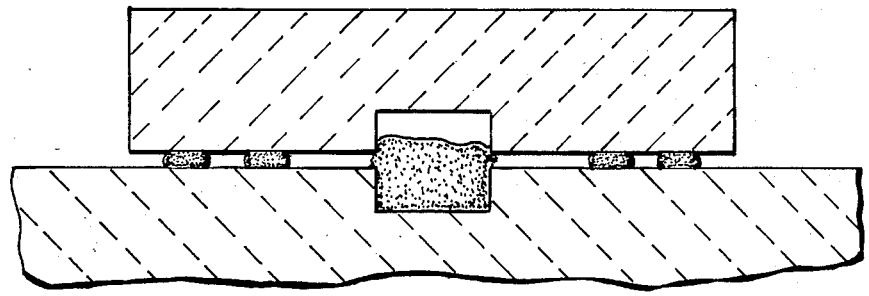

The ball alignment technique of this invention can be used to advantage by choosing a deformable material for the alignment ball when designing for a standoff as shown in FIG. 6. This expedient is particularly useful for aligning the parts then pressing them together to join them. The joining mechanism may be mechanical, e.g. pins on one substrate locking into pin receiving means on the other, or it may be an adhesive, e.g. contact cement or the like. A useful variation of the deformable ball is to form the ball from a low melting material so that the desired deformation occurs upon heating. This expedient is recommended when the parts are to be joined by solder or where solder contacts are to be made. The application shown in FIGS. 7-9 is especially suited for this approach. After the parts are aligned the assembly is heated. As the solder melts the "standoff" disappears and the solder connections are completed in the same operation. A finished assembly, after heating, is shown in FIG. 9B.

It may be useful when bonding chip carriers to support structures to coat the indent in the chip carrier with a material that is readily wetted by the material of the low melting ball and coat the indent in the support board with a material that is not readily wetted. In that case the material of the ball, upon melting, will attach to the chip carrier. Thereafter, chip carriers removed due to defective chips or removed for repair will leave an open indent in the support body which can then be used for installation of a new chip carrier. Applications may be found wherein the molten alignment ball can serve advantageously as a structural bond or an electrical contact in which case both indents should comprise a material that is wetted by the material of the low melting ball. In the latter case, the material of the ball should be conductive.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Method for aligning planar structures face-to-face comprising:

placing a first planar structure face down over a second face-up planar structure so the structures are situated face-to-face and moving one or both structures in one or more directions lying in the plane of the face until a desired alignment between the respective faces is achieved the invention comprising forming an indented region in the face of the first planar structure, forming an indented region in the face of the second planar structure, disposing an aligning ball in one of the indented regions, moving one or both structures until the aligning ball is recessed in both aforementioned indented regions, the invention characterized in that:

a. the alignment ball has a diameter chosen so that when the aligning ball is recessed in both indented regions a separation exists between the planar surfaces, b. the alignment ball is formed of solder and the solder is melted to bring the separated surfaces together, and c. at least one of the indented regions is composed of a material that is not wetted by the molten material of the aligning ball.

2. The method of claim 1 in which the material of said indented region is ceramic.

* * * * *